(12) United States Patent
Moon et al.

(10) Patent No.: US 8,386,882 B2
(45) Date of Patent: Feb. 26, 2013

(54) SET PARTITIONING AND MULTILEVEL CODING

(75) Inventors: Jaekyun Moon, Daejeon (KR); Hemant Thapar, San Jose, CA (US)

(73) Assignee: Link_A_Media Devices Corporation, Santa Clara, CA (US)

(*) Notice: Subject to any disclaimer, the term of this patent is extended or adjusted under 35 U.S.C. 154(b) by 0 days.

(21) Appl. No.: 13/543,096

(22) Filed: Jul. 6, 2012

(65) Prior Publication Data

US 2012/0278680 A1 Nov. 1, 2012

Related U.S. Application Data

(63) Continuation of application No. 12/459,016, filed on Jun. 25, 2009, now Pat. No. 8,239,728.

(60) Provisional application No. 61/133,286, filed on Jun. 27, 2008.

(51) Int. Cl.
*H03M 13/00* (2006.01)

(52) U.S. Cl. .......................................... 714/755

(58) Field of Classification Search ............ 714/755
See application file for complete search history.

(56) References Cited

U.S. PATENT DOCUMENTS

| | | | |
|---|---|---|---|
| 7,904,783 B2* | 3/2011 | Brandman et al. | 714/755 |
| 7,962,827 B2* | 6/2011 | Tang et al. | 714/755 |
| 2005/0157558 A1* | 7/2005 | Noguchi et al. | 365/185.22 |

* cited by examiner

*Primary Examiner* — Albert Decady
*Assistant Examiner* — Enam Ahmed
(74) *Attorney, Agent, or Firm* — Van Pelt, Yi & James LLP

(57) ABSTRACT

A signal is encoded by receiving input data. A first portion of the input data is encoded to obtain a first set of encoded data. At least some part of the input data is processed to determine which one of a plurality of subsets the input data corresponds to. In the event the input data corresponds to a first subset having a greater signal margin (SM) than a second subset, the first set of encoded data and a second portion of the input data are output. In the event the input data corresponds to the second subset, the second portion of the input data is encoded to obtain a second set of encoded data and the first set of encoded data and the second set of encoded data are output.

24 Claims, 9 Drawing Sheets

2-Dimensional
16-QAM

SET PARTITIONING AND MULTILEVEL CODING

CROSS REFERENCE TO OTHER APPLICATIONS

This application is a continuation of co-pending U.S. patent application Ser. No. 12/459,016, entitled SET PARTITIONING AND MULTILEVEL CODING filed Jun. 25, 2009 which claims priority to U.S. Provisional Patent Application No. 61/133,286 entitled SET PARTITIONING AND MULTILEVEL CODING ON HARD-IN HARD-OUT CHANNELS: APPLICATION TO MLC-FLASH filed Jun. 27, 2008 both of which are incorporated herein by reference for all purposes.

BACKGROUND OF THE INVENTION

In a hard-in, hard-out (HIHO) system, information is input and received as hard values or information, as opposed to soft values such as a likelihood or confidence. Storage systems (such as Flash storage systems) are one example application in which HIHO systems exist. For example, a read (write) controller may read back (write) hard values from (to) Flash media. Noise in a Flash storage system may cause errors to occur (i.e., the data read back does not match the original written data). It would be desirable to reduce an error rate of Flash storage systems (or other systems); preferably with little or no increase in system complexity and/or overhead information.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1A:
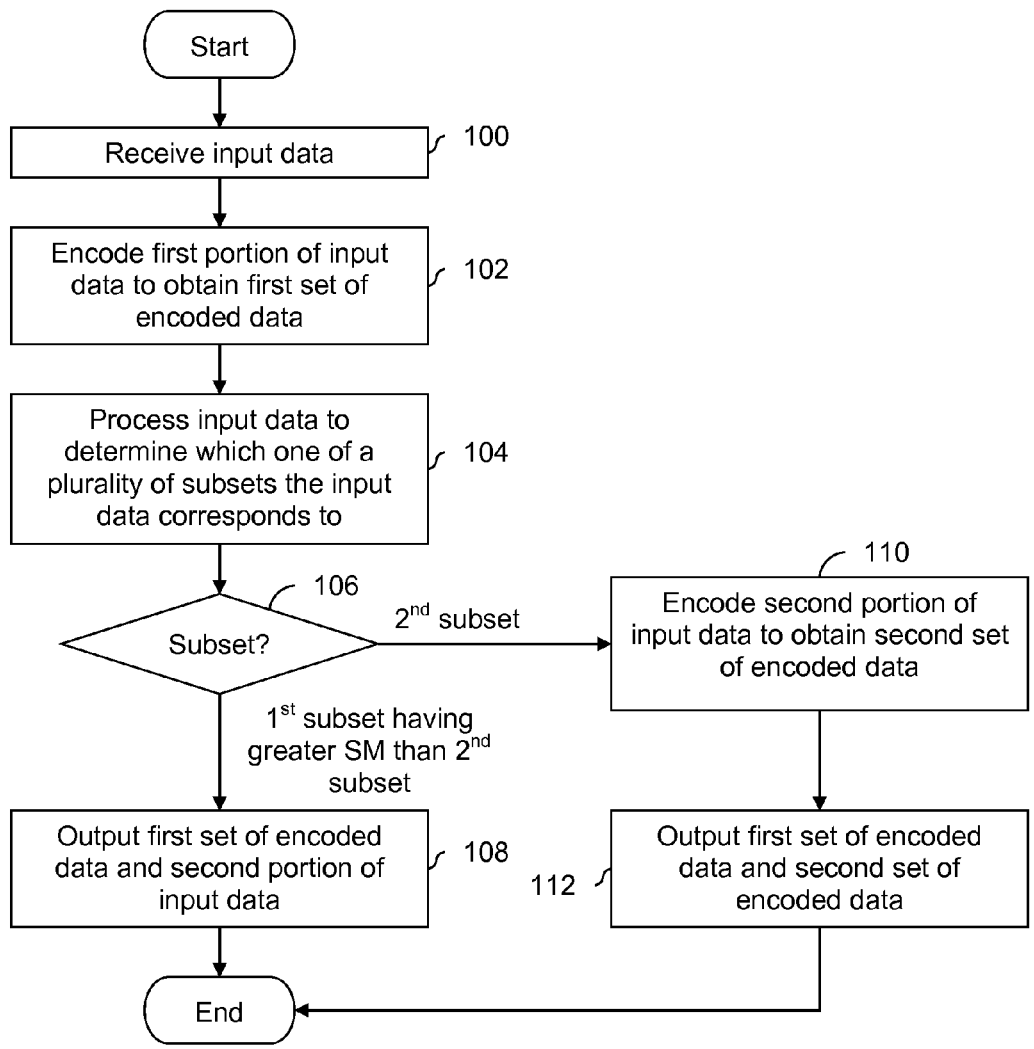
FIG. 1A is a flowchart illustrating an embodiment of a process for encoding data.

FIG. 1A is a flowchart illustrating an embodiment of a process for encoding data. At 100, input data is received. In some embodiments, the input data includes "hard" information or values such as a 1 or 0. A first portion of input data is encoded to obtain a first set of encoded data at 102. In some embodiments, an error correcting code is used. At 104, the input data is processed to determine which one of a plurality of subsets the input data corresponds to. In some embodiments, the first portion of the input data (which is encoded at step 102) identifies which subset the input data corresponds to.

If the input data corresponds to a first subset having a greater signal margin (SM) than a second subset, the first set of encoded data and second portion of input data are output at 108. If the input data corresponds to the second subset then a second portion of the input data is encoded to obtain a second set of encoded data at 110 and the first set of encoded data and second set of encoded data are output at 112. In some embodiments, the second portion of input data (e.g., output at step 108 or encoded at step 110) is all of the input data other than the first portion. In some embodiments, encoding at 102 and encoding at 110 use a first and second code, respectively. In some embodiments, error correcting codes are used at 102 and/or 110. Some examples of the encoding process described above with specific constellations and set groupings are described in further detail below.

Figure 1B:
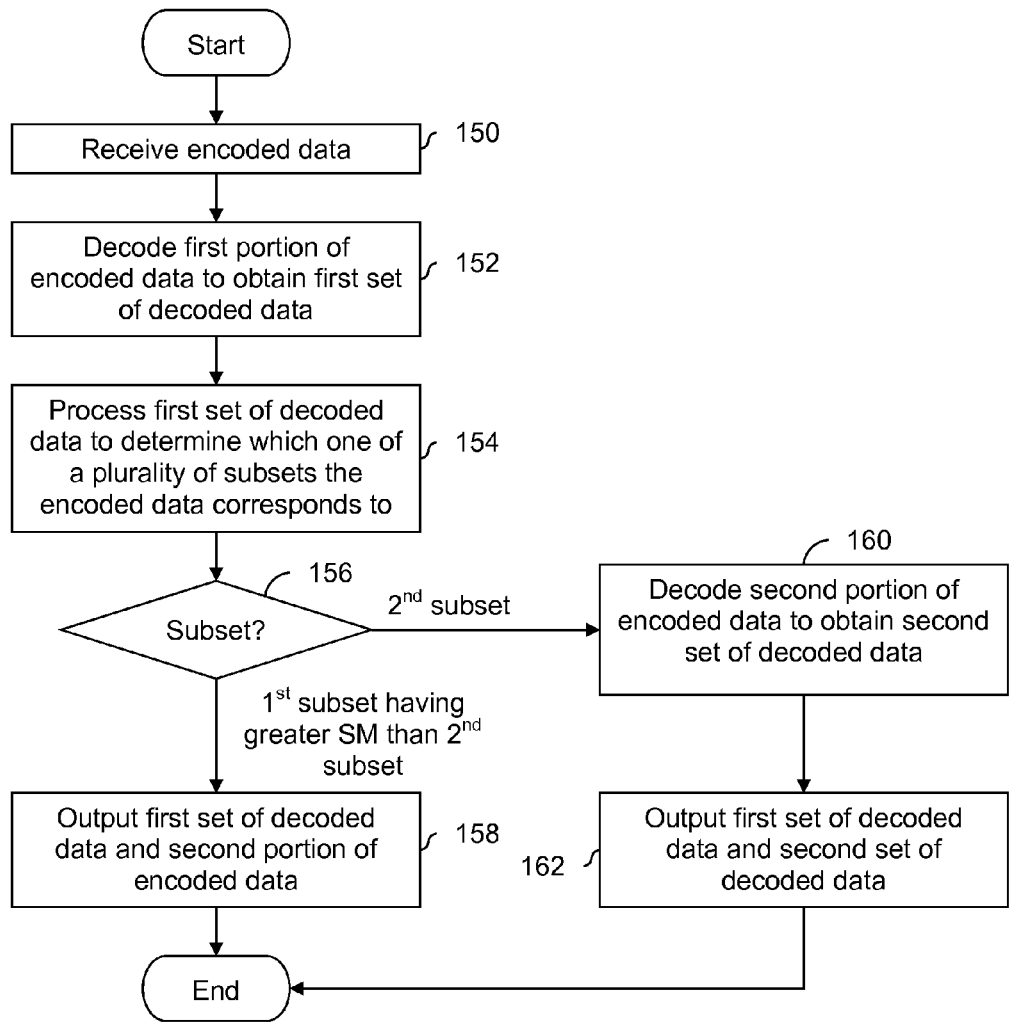
FIG. 1B is a flowchart illustrating an embodiment of a process for decoding data.

FIG. 1B is a flowchart illustrating an embodiment of a process for decoding data. The example decoding process of FIG. 1B can be used to decode information encoded using the process of FIG. 1A. At 150, encoded data is received. A first portion of encoded data is decoded to obtain a first set of decoded data at 152. The code used during decoding at 152 corresponds to the code used at step 102 in FIG. 1A. The first set of decoded data is processed to determine which one of a plurality of subsets the encoded data corresponds to at 104. For example, the value of the first set of decoded data may identify with subset the encoded data corresponds to.

If the encoded data corresponds to a first subset having a greater signal margin than a second subset, then the first set of decoded data and a second portion of the encoded data are output at 158. If the encoded data corresponds to a second subset then a second portion of the encoded data is decoded to obtain a second set of decoded data at 160 and the first set of decoded data and the second set of decoded data are output at 162. A code used during decoding at 160 is the same code as that used during encoding at step 110 in FIG. 1A.

Figure 2:
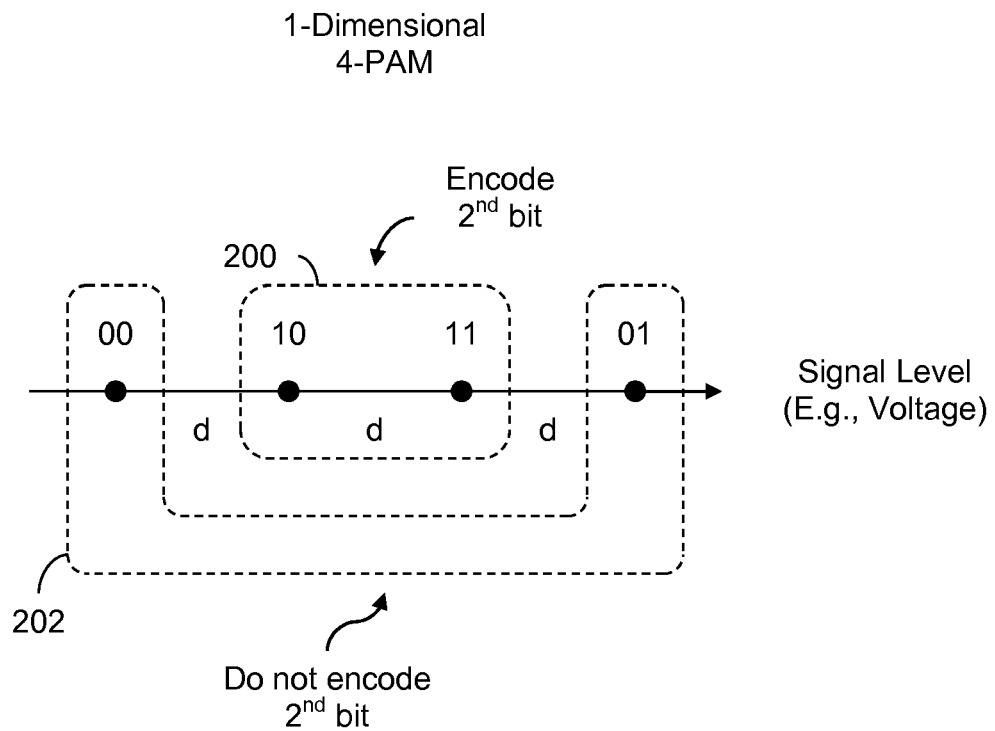
FIG. 2 is a diagram illustrating an embodiment of a 1-dimensional, 4 Pulse Amplitude Modulation (PAM) constellation.

FIG. 2 is a diagram illustrating an embodiment of a 1-dimensional, 4 Pulse Amplitude Modulation (PAM) constellation. In the example shown, the x-axis corresponds to a signal level (e.g., voltage) and there are four possible signal levels that are exchanged over a channel (e.g., transmitted/received via a wireless channel or written to and read back from a storage device). Each of the four symbols in the constellation is assigned or otherwise corresponds to a two bit vale. From the lowest signal level to highest signal level (i.e., from left to right in FIG. 1) the values are: 00, 10, 11, and 01. The system shown is a hard in, hard out (HIHO) system where hard values are input and output. In a wireless application, this means information is transmitted and received as hard values (e.g., a 1 or a 0) as opposed to soft values (e.g., a 0.5 value). Similarly, in a storage application, information is written and read back as hard values in a HIHO system.

The four symbols in the constellation are divided into two subsets. Subset 200 includes the two inner symbols (i.e., 10 and 11) and subset 202 includes the two outer symbols (i.e., 00 and 01). With the bit assignment and subset partitioning used in this particular example, the first bit indicates which subset a particular symbol belongs to (e.g., both symbols in subset 200 start with a 1 and both symbols in subset 202 start with a 0).

The symbols in outer subset 202 (i.e., 00 and 01) are separated by a distance of 3 d which corresponds to an effective signal margin (SM) of 1.5 d, where d is the minimum symbol distance in the original constellation. As used herein, an SM is defined to be a minimum amount of noise required in order for a symbol to be received incorrectly. In contrast, the SM of the entire constellation comprising of all four symbols is 0.5 d. An increase from 0.5 d to 1.5 d corresponds to a 9.54 dB SNR gain. Unlike soft-out systems, the Euclidean distance between symbols in a subset is no longer an appropriate measure of performance for hard out systems.

As for subset 200, the SM is 0.5 d, which is the same as the entire constellation comprising of 4 symbols. With respect to subset 200, there is no signal enhancement obtained by the set partitioning. Since subset 202 has a better SM than subset 200, the symbols in subset 202 do not require as much error correction protection from an error correction code compared to the symbols in subset 200 because of the greater SM.

In the example shown, the symbols are grouped using SM-enhancing set partitioning. Using SM-enhancing set partitioning can result in an extended error correction capability given the same coding overhead. For 4-PAM, the error correction capability extends from t=30 to t=38, assuming a Bose-Chaudhuri-Hocquenghem (BCH) code with 1K byte sector. The price paid is a reasonably small increase in complexity. For 8-PAM channels (3 bits), the effective gain is from t=30 to t=47, with virtually no increase in complexity.

The following figures illustrate example encoder and decoder processes corresponding to the 1-D, 4-PAM constellation and subsets shown in FIG. 2.

Figure 3:
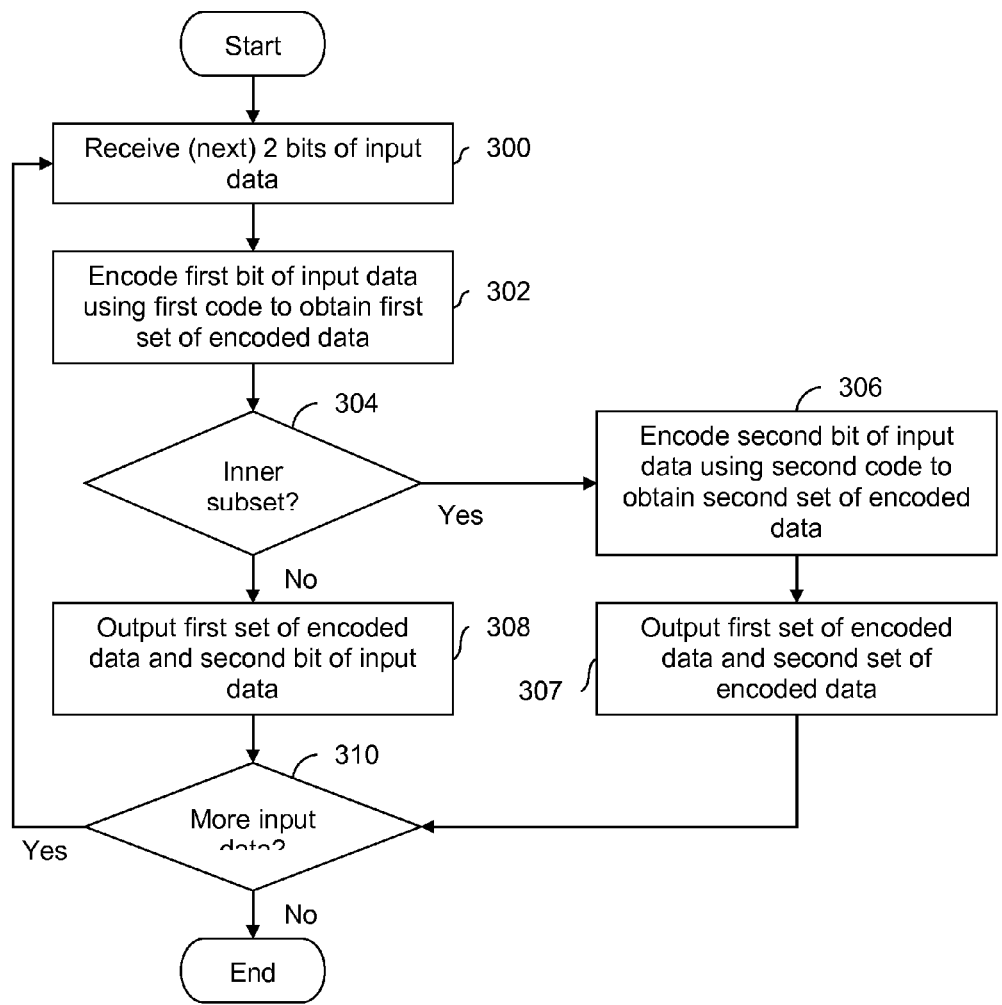
FIG. 3 is a flowchart illustrating an embodiment of a process for encoding a 1-dimensional, 4-PAM constellation.

FIG. 3 is a flowchart illustrating an embodiment of a process for encoding a 1-dimensional, 4-PAM constellation. In the example shown, the constellation and set partitions shown in FIG. 1 are used. In some embodiments, the encoding process shown is performed by a write controller that generates and sends write data to storage, such as Flash storage. In some other embodiments, some other process is used to encode the constellation and set partitions of FIG. 1.

At 300, two bits of input data are received. The possible inputs for this particular example are 00, 10, 11, and 01. The first bit of input data is encoded using a first code to obtain a first set of encoded data at 302. As an example, if the input data is 10, then the first set of encoded data is $enc_1(1)$ where $enc_1(\ )$ is the first code. In some embodiments, the first code is an error correcting code, some examples of which include Reed-Solomon and BCH codes. Although this example and other examples show a beginning portion of input data being encoded regardless of subset (e.g., at step 302), in some other embodiments an ending portion is the portion that is always encoded regardless of subset.

At 304, it is determined if the input data corresponds to the inner subset (e.g., subset 200 in FIG. 2). With the constellation and set partitioning shown in FIG. 1, if the first bit is a 1 then it is in the inner subset; if the first bit is a 0 then it is in the outer subset. If it is in the inner subset then the second bit of input data is encoded using a second code to obtain a second set of encoded data at 306 and the first set of encoded data and second set of encoded data are output at 307. Using 10 as an example, this includes generating $enc_2(0)$ at 306 and outputting $enc_1(1)$ and $enc_2(0)$ at 307.

Otherwise, if the input data corresponds to the outer subset then the first set of encoded data and second bit of input data are output at 308. Using 01 as an example, $enc_1(0)$ and 1 are output at 308. In some embodiments, the first code and the second code used at 302 and 306 are the same. In some embodiments, the first code and/or the second code used at 302/306 are error correcting codes.

After outputting information at 307 or 308, it is determined if there is more input data at 310. If so, the (next) 2 bits of input data are received at 300.

In the above example, encoding is applied to the first bit (which specifies the subset) and then the second bit is encoded if the first bit indicates an inner subset. Since the inner subset occurs 50% of the time in random data, coding is applied on 1.5 bits on average out of every two bits. Compared to a conventional system that employs a code with (for example) 5% coding overhead, this scheme effectively enjoy error correction protection of a 6.67% overhead code. This can be seen from the effective overall coding overhead of the present scheme based on applying a 6.67% overhead code on 1.5 bits and no code on 0.5 bit:

$$(1.5/2) \times 6.67\% + (0.5/2) \times 0\% = 5\%$$

In some embodiments, the second bit (or, more generally, a second portion of the input data) is encoded with a weaker code if it in the outer subset and is encoded with a stronger code if it is in the inner subset. For example, a stronger code may generate more redundant information but have stronger error correction capabilities compared to a weaker code. A weaker code may be sufficient for the outer subset and desirable since less redundant information needs to be written to storage media or transmitted over a wireless channel.

Figure 4:
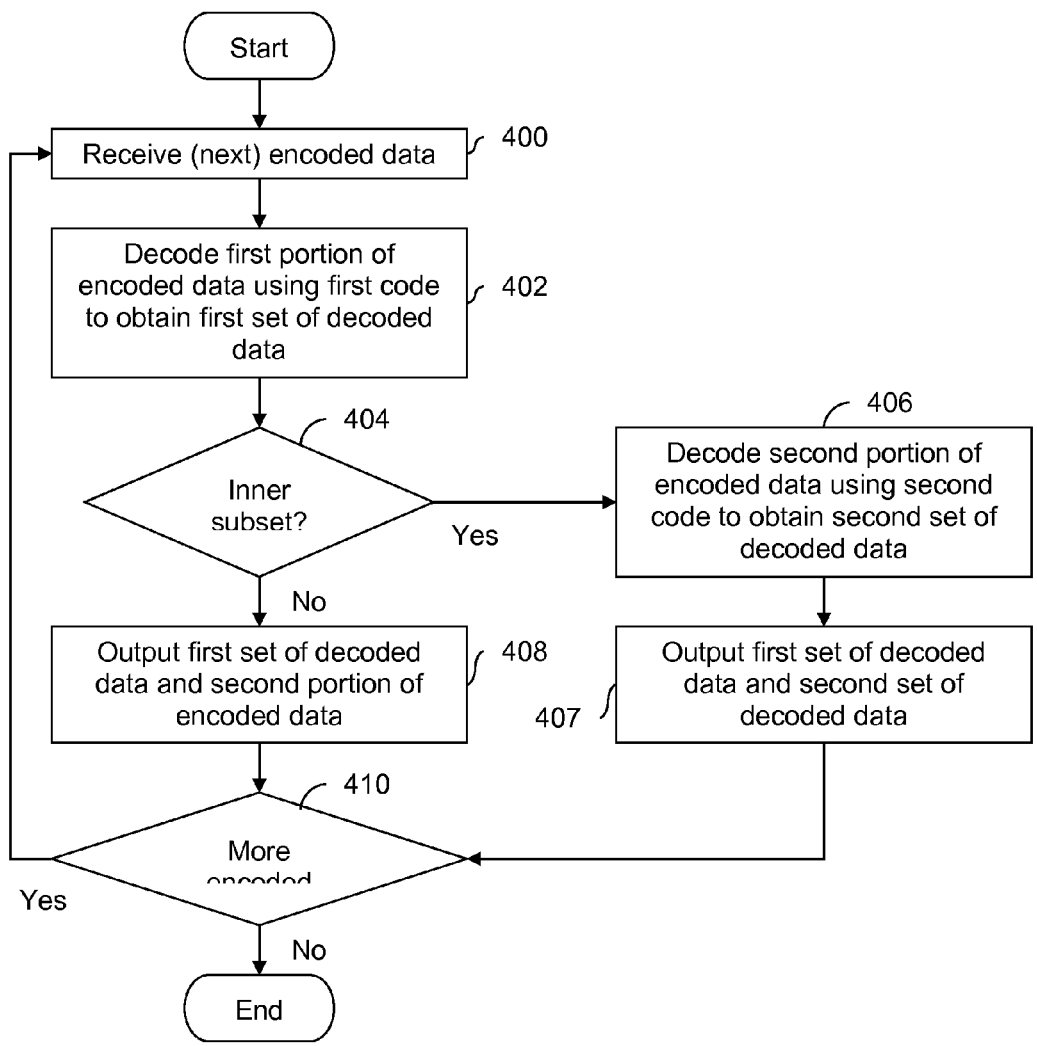
FIG. 4 is a flowchart illustrating an embodiment of a process for decoded a 1-dimensional, 4-PAM constellation.

FIG. 4 is a flowchart illustrating an embodiment of a process for decoded a 1-dimensional, 4-PAM constellation. In some embodiments, the process is performed by a read controller that reads back data from storage. The example process corresponds to the constellation and set partitions shown in FIG. 1. In some other embodiments, some other process is used to decode the constellation and set partitions of FIG. 1.

At 400, encoded data is received. A first portion of encoded data is decoded using a first code to obtain a first set of decoded data at 402. For example, if the first set of encoded data generated at step 302 in FIG. 3 is two bits long then the first portion of encoded data processed at 402 is that long. It is determined at 404 whether it is in an inner subset. For example, if after decoding the result is a 1 then it is in the inner subset (e.g., subset 200 in FIG. 2). If after decoding it is a 0 then it is in the outer subset (e.g., subset 202 in FIG. 2).

If it is in the inner subset then a second portion of encoded data is decoded using a second code to obtain a second set of decoded data at 406. The first set of decoded data and second set of decoded data are output at 407. Otherwise, if it is in the outer subset then the first set of decoded data and second portion of encoded data is output at 408. For symbols in the outer subset, the second bit/portion was not encoded so no processing is required and it is output as-is.

At 410 it is determined if there is more encoded data. If so, the next encoded data is received at 400.

Figure 5:
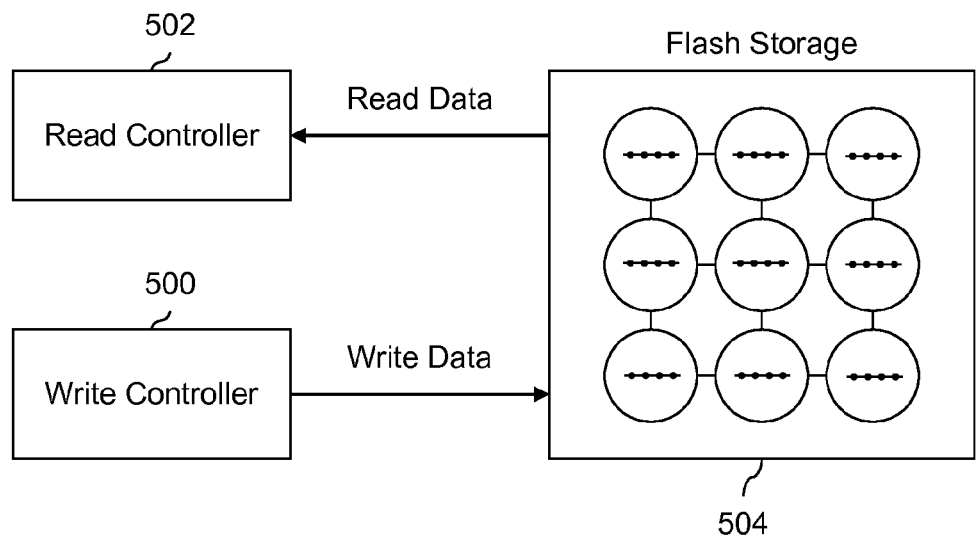
FIG. 5 is a diagram showing an embodiment of a system for encoding and decoding a 1-dimensional, 4-PAM constellation.

FIG. 5 is a diagram showing an embodiment of a system for encoding and decoding a 1-dimensional, 4-PAM constellation. In the example shown, write controller 500 performs the encoding process shown in FIG. 3 and read controller 502 performs the decoding process shown in FIG. 4. Each controller writes and reads data to/from flash storage 504 which includes a plurality of cells. Each cell in flash storage 504 is capable of storing one of four levels (i.e., two-bit capacity per cell). In some other embodiments, a different type of storage media other than Flash is used.

The technique described above can be extended to additional dimensions and/or a constellation with a larger number of symbols. The following figures show examples of a 2-dimensional, 16-QAM constellation and subsets.

Figure 6:
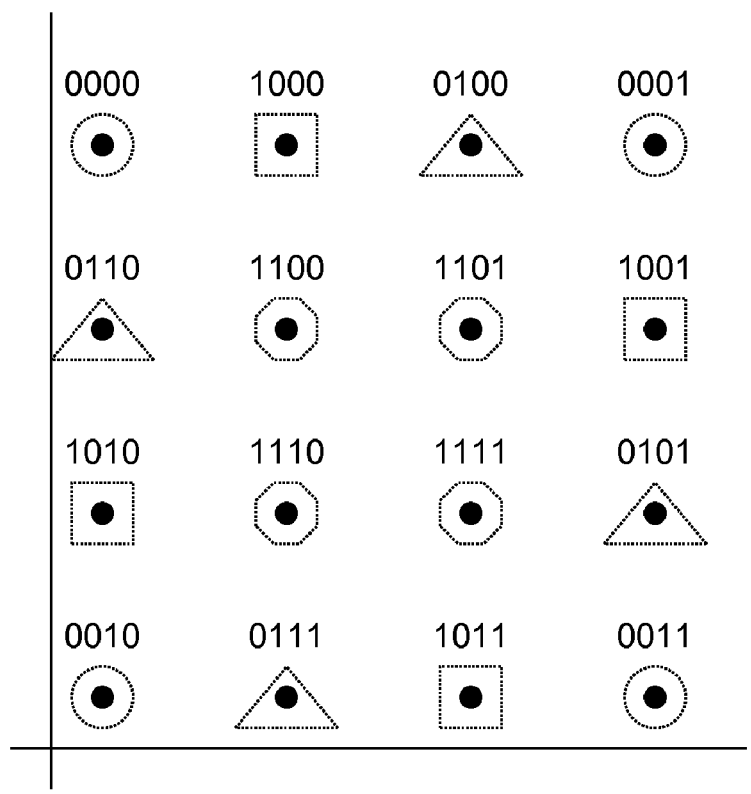
FIG. 6 is a diagram illustrating an embodiment of a 2-dimensional, 16 Quadrature Amplitude Modulation (QAM) constellation.
Figure 6:
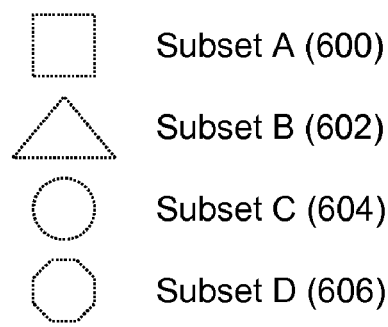

FIG. 6 is a diagram illustrating an embodiment of a 2-dimensional, 16 Quadrature Amplitude Modulation (QAM) constellation. In the example shown, there are 16 symbols in the constellation distributed 4 wide and 4 high along the x-axis and y-axis. Each symbol is assigned or otherwise corresponds to a 4-bit value. The 16 symbols are grouped into 4 subsets, each subset containing 4 symbols. The symbols in subset A (600) are surrounded by a dotted square, the symbols in subset B (602) are surrounded by a dotted triangle, the symbols in subset C (604) are surrounded by a dotted circle, and the symbols in subset D (606) are surrounded by a dotted octagon. Subset A (600) includes 1000, 1001, 1010, and 1011; subset B (602) includes 0100, 0110, 0101, and 0111; subset C (604) includes 0000, 0001, 0010, and 0011; subset D (606) includes 1100, 1101, 1110, and 1111.

The sets shown in this example are created so as to enhance SM as much as possible for each layer of coding. There are a variety of ways of arranging subsets (i.e., assigning bits) to obtain the same (enhanced) SM.

In the example shown, the order of signal margins (SM) is: SM(C)>SM(A), SM(B)>SM(D). The following figures show some example systems for encoding and decoding the example constellation and set groupings shown in FIG. 6.

Figure 7:
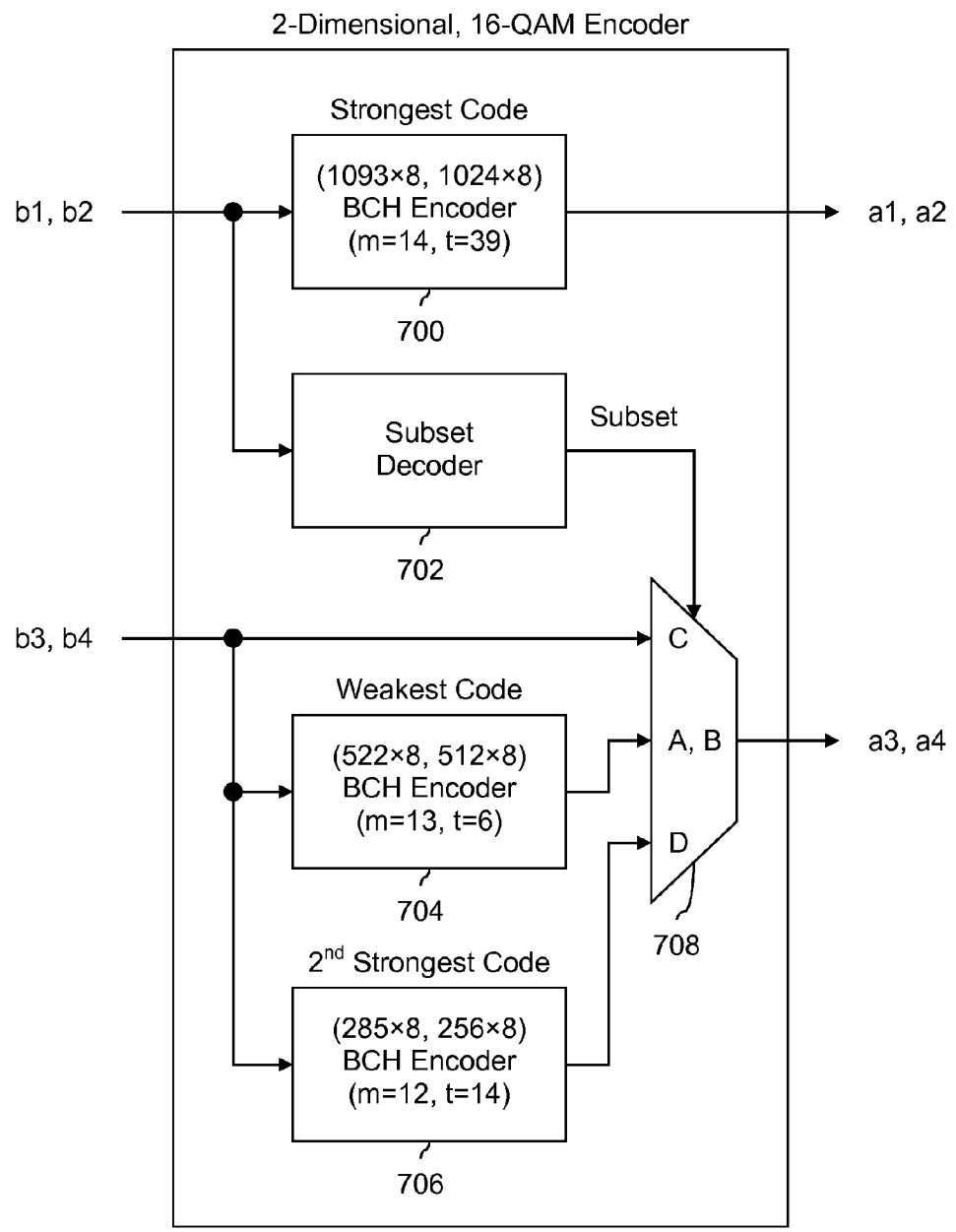
FIG. 7 is a diagram showing an embodiment of a 2-dimensional, 16-QAM encoder.

FIG. 7 is a diagram showing an embodiment of a 2-dimensional, 16-QAM encoder. In the example shown, the encoder shown is used in combination with the constellation and set grouping shown in FIG. 6. In the example shown, b1-b4 are the four input bits being encoded and the values a1-a4 are the resulting encoded values.

The first two input bits, b1 and b2, are passed to BCH encoder 700 and subset decoder 702. BCH encoder 700 uses the strongest code of the BCH encoders shown and is a (1093×8, 1024×8) BCH code with m=14 and t=39. The first two bits of input data, b1 and b2, are encoded using the strongest BCH encoder (700) regardless of which subset the input data corresponds to. The output of strongest BCH encoder 700 are a1 and a2.

Subset decoder 702 determines which subset the input data corresponds to based on the value of the first two bits. Referring back to FIG. 6, if the first two bits are 10 then the subset is subset A, if the first two bits are 01 then the subset is subset B, if the first two bits are 00 then the subset is subset C, and if the first two bits are 11 then the subset is subset D.

The third and fourth input bits are passed to BCH encoder 704 with the weakest code, BCH encoder 706 with the second strongest code, and multiplexer 708. The subset is passed from subset decoder 702 to multiplexer 708 and controls which one of the multiplexer's inputs is output. If the subset is subset C, the third and fourth output bits (b3 and b4) are output without any processing. Referring back to FIG. 6, subset C has the greatest signal margin since those symbols are positioned the furthest apart in the constellation. If the subset is subset A or B, the encoded data generated by the weakest BCH encoder 702 is output. Symbols are subset A and B are slightly closer to each other (within their respective subset) compared to subset C so coding (e.g., error correction coding) is used. If the subset is subset D, then the encoded data generated by the second strongest BCH encoder 704 is output. The outputs of multiplexer 708 are a3 and a4.

The system shown herein is merely one example. In some embodiments, the same code is used for the first two bits (regardless of subset) and the third and fourth bits for the subset with the smallest SM. That is, in some embodiments, encoder 700 and 706 use the same code. In some embodiments, to save power, encoder 704 and 706 are only activated if needed (e.g., depending upon the subset output by subset decoder 702).

Figure 8:
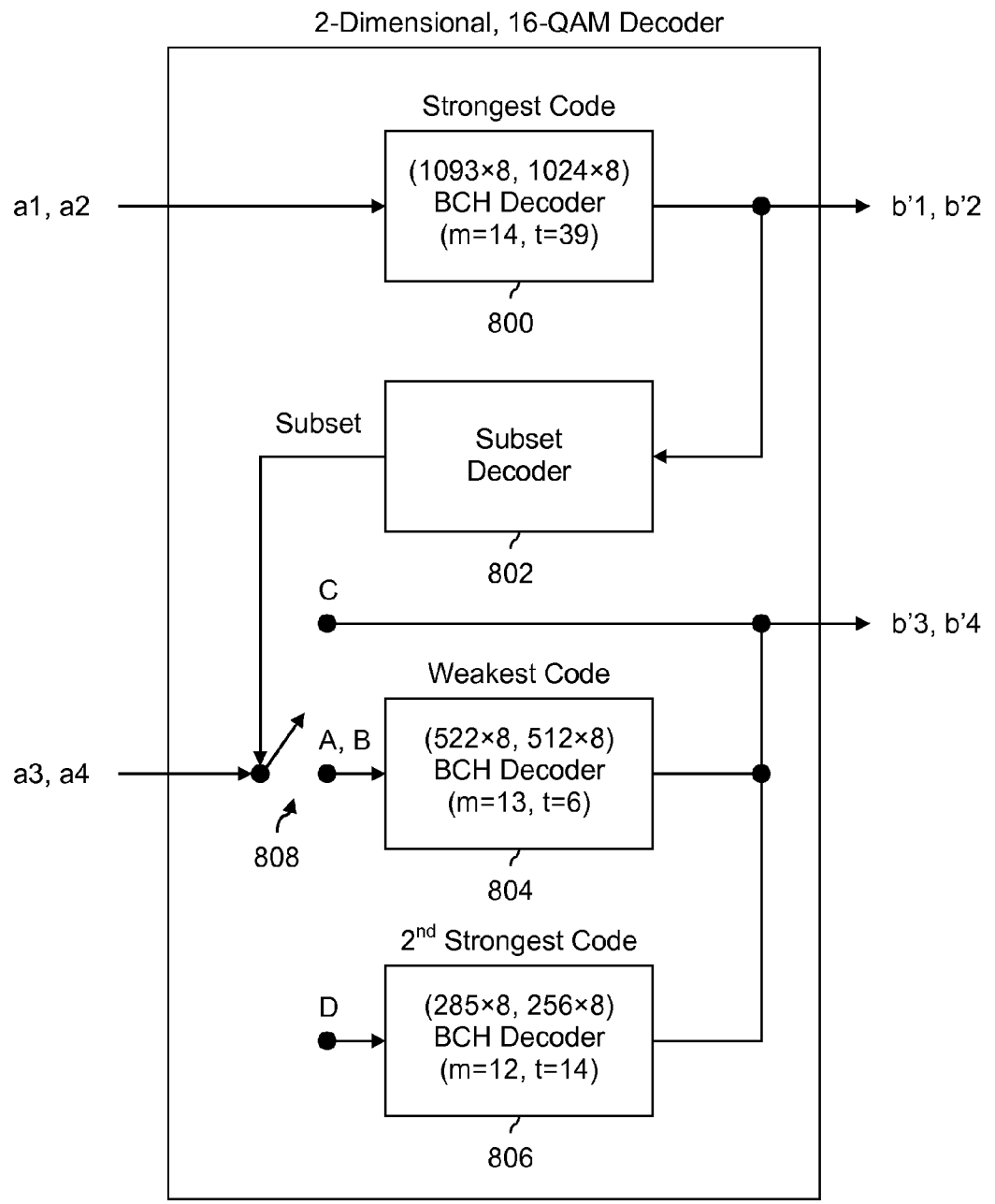
FIG. 8 is a diagram showing an embodiment of a 2-dimensional, 16-QAM decoder.

FIG. 8 is a diagram showing an embodiment of a 2-dimensional, 16-QAM decoder. In the example shown, the decoder shown is used in combination with the constellation and set grouping shown in FIG. 6.

Encoded data a1 and a2 is input to BCH decoder 800 which uses the strongest code of the decoders shown in this figure. The decoded bits b'1 and b'2 are output and if decoding is performed properly, the decoded bits b'1 and b'2 match the original input bits b1 and b2 from FIG. 7.

The decoded bits b'1 and b'2 are passed to subset decoder 802 which determines which subset the encoded data a1-a4 corresponds to based on the values of b'1 and b'2. The decision making employed by subset decoder 802 is similar to that of subset decoder 702 from FIG. 7 described above. The subset is output by subset decoder 702 and is passed to switch 808. Switch 808 controls if encoded data a3 and a4 are passed: (1) directly out as decoded bits b'1 and b'2, (2) to the weakest BCH decoder 804, or (3) to the second strongest BCH decoder 806. The switch goes to the first position for subset C, the second position for subset A or B, and the third position for subset D. If processing has been performed properly then b'3 and b'4 will equal the original bits b3 and b4 input in FIG. 7.

The technique described above is applicable other constellations (e.g., 1-D, 8-PAM or 2-D, 64-QAM). In general, a larger constellation may yield a larger gain. For example, in one example of a 1-D, 8-PAM system (used in, for example, 3 bits/cell HIHO Flash) the constellation is partitioned into 4 subsets, with each subset attaining a 9.54 dB SM increase. In some embodiments, two bits out of every three bits are used to specify the subset and are encoded with a strong code. No other codes are necessary in some embodiments, and the overall complexity is comparable to the conventional single-level code. The code performance with a 5% coding overhead is similar to that of a conventional code with 7.5% overhead, as can be seen from the equation:

$(2/3) \times 7.5\% + (1/3) \times 0\% = 5\%$

A conventional (1078×8, 1024×8) BCH code (m=14, t=30, coding overhead=5%) applied to the natural 8-PAM constellation needs a 33.22 dB SNR (defined as the peak-to-noise ratio) to achieve a decoder failure rate of $10^{-10}$. In comparison, a (1107×8, 1024×8) BCH code (m=14, t=47, coding overhead=7.5%) used in the proposed configuration requires a 32.71 dB SNR to achieve the same decoder failure rate. This translates to a 0.5 dB SNR gain for the proposed system.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for encoding data, comprising:
  receiving input data, wherein the input data includes a first portion and a second portion;
  determining, based at least in part on the first portion and without taking into consideration the second portion, whether the input data is associated with either a first set of values or a second set of values, wherein the first set of values has a signal margin that is greater than the second set of values;
  using a processor to encode the first portion using an error correction code to obtain output data corresponding to the first portion;
  outputting the output data corresponding to the first portion;
  in the event the input data is associated with the first set of values:
    obtaining output data corresponding to the second portion by applying less error correction coding protection to the second portion than if the input data were associated with the second set of values; and
    outputting the output data corresponding to the second portion obtained by applying less error correction coding protection to the second portion than if the input data were associated with the second set of values; and
  in the event the input data is associated with the second set of values:
    obtaining output data corresponding to the second portion by applying more error correction coding protection to the second portion than if the input data were associated with the first set of values; and
    outputting the output data corresponding to the second portion obtained by applying more error correction coding protection to the second portion than if the input data were associated with the first set of values.

2. The method of claim 1, wherein the input data includes Pulse Amplitude Modulation (PAM) data and the input data is received from a modulator configured to generate PAM data.

3. The method of claim 1, wherein applying less error correction coding protection to the second portion includes performing no encoding on the second portion using an error correction code such that the output data corresponding to the second portion is the second portion.

4. The method of claim 1, wherein:
  applying less error correction coding protection to the second portion includes encoding the second portion using a weaker error correction code than if the input data were associated with the second set of values; and
  applying more error correction coding protection to the second portion includes encoding the second portion using a stronger error correction code than if the input data were associated with the first set of values.

5. The method of claim 1 further comprising: storing at least the output data corresponding to the first portion.

6. The method of claim 5, wherein storing includes storing on Flash storage.

7. The method of claim 1 further comprising: transmitting at least the output data corresponding to the first portion.

8. The method of claim 7, wherein transmitting includes transmitting over a wireless channel.

9. A system for encoding data, comprising:
  a processor; and
  a memory coupled with the processor, wherein the memory is configured to provide the processor with instructions which when executed cause the processor to:
    receive input data, wherein the input data includes a first portion and a second portion;
    determine, based at least in part on the first portion and without taking into consideration the second portion, whether the input data is associated with either a first set of values or a second set of values, wherein the first set of values has a signal margin that is greater than the second set of values;
    encode the first portion using an error correction code to obtain output data corresponding to the first portion;
    output the output data corresponding to the first portion;
    in the event the input data is associated with the first set of values:
      obtain output data corresponding to the second portion by applying less error correction coding protection to the second portion than if the input data were associated with the second set of values; and
      output the output data corresponding to the second portion obtained by applying less error correction coding protection to the second portion than if the input data were associated with the second set of values; and
    in the event the input data is associated with the second set of values:
      obtain output data corresponding to the second portion by applying more error correction coding protection to the second portion than if the input data were associated with the first set of values; and
      output the output data corresponding to the second portion obtained by applying more error correction coding protection to the second portion than if the input data were associated with the first set of values.

10. The system of claim 1, wherein the input data includes Pulse Amplitude Modulation (PAM) data and the input data is received from a modulator configured to generate PAM data.

11. The system of claim 1, wherein the instructions for applying less error correction coding is protection to the second portion include instructions which when executed cause the processor to perform no encoding on the second portion using an error correction code such that the output data corresponding to the second portion is the second portion.

12. The system of claim 1, wherein:
  the instructions for applying less error correction coding protection to the second portion include instructions which when executed cause the processor to encode the second portion using a weaker error correction code than if the input data were associated with the second set of values; and
  the instructions for applying more error correction coding protection to the second portion include instructions which when executed cause the processor to encode the second portion using a stronger error correction code than if the input data were associated with the first set of values.

13. A method for decoding data, comprising:
receiving input data, wherein the input data includes a first portion and a second portion;
using a processor to decode the first portion using an error correction code to obtain output data corresponding to the first portion;
determining, based at least in part on the output data corresponding to the first portion and without taking into consideration the second portion, whether the input data is associated with either a first set of values or a second set of values, wherein the first set of values has a signal margin that is greater than the second set of values;
outputting the output data corresponding to the first portion;
in the event the input data is associated with the first set of values:
 obtaining output data corresponding to the second portion by undoing less error correction coding protection applied to the second portion than if the input data were associated with the second set of values; and
 outputting the output data corresponding to the second portion obtained by undoing less error correction coding protection applied to the second portion than if the input data were associated with the second set of values; and
in the event the input data is associated with the second set of values:
 is obtaining output data corresponding to the second portion by undoing more error correction coding protection applied to the second portion than if the input data were associated with the first set of values; and
 outputting the output data corresponding to the second portion obtained by undoing more error correction coding protection applied to the second portion than if the input data were associated with the first set of values.

14. The method of claim 13, wherein the output data includes Pulse Amplitude Modulation (PAM) data and the output data is passed to a demodulator configured to demodulate PAM data.

15. The method of claim 13, wherein undoing less error correction coding protection applied to the second portion includes performing no decoding on the second portion using an error correction code such that the output data corresponding to the second portion is the second portion.

16. The method of claim 13, wherein:
undoing less error correction coding protection applied to the second portion includes decoding the second portion using a weaker error correction code than if the input data were associated with the second set of values; and
undoing more error correction coding protection applied to the second portion includes decoding the second portion using a stronger error correction code than if the input data were associated with the first set of values.

17. The method of claim 13, wherein the input data is received from storage.

18. The method of claim 17, wherein storage includes Flash storage.

19. The method of claim 13, wherein the input data is received from a communications receiver.

20. The method of claim 19, wherein the communications receiver includes a communications receiver configured to communicate over a wireless channel.

21. A system for decoding data, comprising:
receiving input data, wherein the input data includes a first portion and a second portion;
decoding the first portion using an error correction code to obtain output data corresponding to the first portion;
determining, based at least in part on the output data corresponding to the first portion and without taking into consideration the second portion, whether the input data is associated with either a first set of values or a second set of values, wherein the first set of values has a signal margin that is greater than the second set of values;
outputting the output data corresponding to the first portion;
in the event the input data is associated with the first set of values:
 obtaining output data corresponding to the second portion by undoing less error correction coding protection applied to the second portion than if the input data were associated with the second set of values; and
 outputting the output data corresponding to the second portion obtained by undoing less error correction coding protection applied to the second portion than if the input data were associated with the second set of values; and
in the event the input data is associated with the second set of values:
 obtaining output data corresponding to the second portion by undoing more error correction coding protection applied to the second portion than if the input data were associated with the first set of values; and
 outputting the output data corresponding to the second portion obtained by undoing more error correction coding protection applied to the second portion than if the input data were associated with the first set of values.

22. The system of claim 21, wherein the output data includes Pulse Amplitude Modulation (PAM) data and the output data is passed to a demodulator configured to demodulate PAM data.

23. The system of claim 21, wherein the instructions for undoing less error correction coding protection applied to the second portion include instructions which when executed cause the processor to perform no decoding on the second portion using an error correction code such that the output data corresponding to the second portion is the second portion.

24. The system of claim 21, wherein:
the instructions for undoing less error correction coding protection applied to the second portion include instructions which when executed cause the processor to decode the second portion using a weaker error correction code than if the input data were associated with the second set of values; and
the instructions for undoing more error correction coding protection applied to the second portion include instructions which when executed cause the processor to decode the second portion using a stronger error correction code than if the input data were associated with the first set of values.

* * * * *

UNITED STATES PATENT AND TRADEMARK OFFICE
CERTIFICATE OF CORRECTION

PATENT NO. : 8,386,882 B2
APPLICATION NO. : 13/543096
DATED : February 26, 2013
INVENTOR(S) : Moon et al.

It is certified that error appears in the above-identified patent and that said Letters Patent is hereby corrected as shown below:

In the claims

Column 8, line 53, claim 11, delete "is"
Column 9, line 22, claim 13, delete "undoing" and insert -- doing --
Column 9, line 26, claim 13, delete "undoing" and insert -- doing --
Column 9, line 32, claim 13, delete "is"
Column 9, line 33, claim 13, delete "undoing" and insert -- doing --
Column 9, line 37, claim 13, delete "undoing" and insert -- doing --
Column 9, line 45, claim 15, delete "undoing" and insert -- doing --
Column 9, line 51, claim 16, delete "undoing" and insert -- doing --
Column 9, line 55, claim 16, delete "undoing" and insert -- doing --
Column 10, line 20, claim 21, delete "undoing" and insert -- doing --
Column 10, line 24, claim 21, delete "undoing" and insert -- doing --
Column 10, line 31, claim 21, delete "undoing" and insert -- doing --
Column 10, line 35, claim 21, delete "undoing" and insert -- doing --
Column 10, line 44, claim 23, delete "undoing" and insert -- doing --
Column 10, line 51, claim 24, delete "undoing" and insert -- doing --
Column 10, line 57, claim 24, delete "undoing" and insert -- doing --

Signed and Sealed this
Ninth Day of February, 2016

Michelle K. Lee
*Director of the United States Patent and Trademark Office*